United States Patent
Hua et al.

(10) Patent No.: US 9,860,988 B2
(45) Date of Patent: Jan. 2, 2018

(54) SOLDER CONTACTS FOR SOCKET ASSEMBLIES

(71) Applicant: INTEL CORPORATION, Santa Clara, CA (US)

(72) Inventors: Fay Hua, Fremont, CA (US); Hong Xie, Phoenix, AZ (US); Gregorio R. Murtagian, Phoenix, AZ (US); Amit Abraham, Hillsboro, OR (US); Alan C. Mcallister, Portland, OR (US); Ting Zhong, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 27 days.

(21) Appl. No.: 14/780,501

(22) PCT Filed: Dec. 20, 2014

(86) PCT No.: PCT/US2014/071750
§ 371 (c)(1),
(2) Date: Sep. 25, 2015

(87) PCT Pub. No.: WO2016/099572
PCT Pub. Date: Jun. 23, 2016

(65) Prior Publication Data
US 2016/0338199 A1    Nov. 17, 2016

(51) Int. Cl.
*H05K 1/11* (2006.01)
*H05K 1/18* (2006.01)
(Continued)

(52) U.S. Cl.
CPC ........ *H05K 1/181* (2013.01); *H01L 23/49811* (2013.01); *H01L 23/49816* (2013.01);
(Continued)

(58) Field of Classification Search
CPC ........... H05K 1/11; H05K 1/145; H05K 1/144
See application file for complete search history.

(56) References Cited

U.S. PATENT DOCUMENTS

| 5,597,332 A | 1/1997 | Walbrecht |
| 6,208,156 B1 | 3/2001 | Hembree |

(Continued)

FOREIGN PATENT DOCUMENTS

| JP | H06017176 A | 1/1998 |
| JP | 2008162238 A | 7/2008 |

(Continued)

OTHER PUBLICATIONS

International Search Report and Written Opinion dated Sep. 17, 2015 for International Application No. PCT/US2014/071750, 12 pages.

(Continued)

*Primary Examiner* — Jeremy C Norris
(74) *Attorney, Agent, or Firm* — Schwabe, Williamson & Wyatt, P.C.

(57) ABSTRACT

Embodiments of the present disclosure are directed towards techniques and configurations to provide solder contacts for electrical connection in socket assemblies. In one embodiment, a solder contact may be disposed on the bottom surface of a die package such that the solder contact is conductively coupled to electrical contacts of the die package. The solder contacts may be disposed to be coupled to pins of a socket assembly, to provide conductive coupling of the electrical contacts of the die package and the pins of the socket assembly. The solder may be selected to be sufficiently soft to provide for better electrical conduction. The pins may also be configured to penetrate the solder contact to provide for better electrical conduction. Other embodiments may be described and/or claimed.

24 Claims, 4 Drawing Sheets

(51) Int. Cl.
  *H01R 12/52* (2011.01)
  *H01L 23/498* (2006.01)
  *H01R 33/76* (2006.01)
  *H05K 3/34* (2006.01)
  *H05K 3/40* (2006.01)

(52) U.S. Cl.
  CPC .......... *H01R 12/52* (2013.01); *H01R 33/7607* (2013.01); *H05K 3/3421* (2013.01); *H05K 3/4007* (2013.01); *H01L 2224/00* (2013.01); *H05K 2201/10719* (2013.01)

(56) References Cited

U.S. PATENT DOCUMENTS

| | | | |
|---|---|---|---|
| 7,256,491 B2 * | 8/2007 | Fery | G05B 19/41865 257/706 |
| 8,177,561 B2 | 5/2012 | Ouchi et al. | |
| 8,317,529 B2 | 11/2012 | Katano | |
| 9,214,410 B2 | 12/2015 | Kim et al. | |
| 9,236,476 B2 | 1/2016 | Pillarisetty et al. | |
| 9,277,654 B2 * | 3/2016 | Rathburn | H01L 23/49811 |
| 2005/0182585 A1 | 8/2005 | Yang | |
| 2005/0205865 A1 | 9/2005 | Kuan et al. | |
| 2008/0305695 A1 | 12/2008 | Yodogawa | |
| 2009/0081889 A1 | 3/2009 | Ramaswamy et al. | |
| 2011/0038124 A1 | 2/2011 | Burnham et al. | |
| 2013/0270691 A1 | 10/2013 | Mallik et al. | |

FOREIGN PATENT DOCUMENTS

| | | |
|---|---|---|
| JP | 2012233870 A | 11/2012 |
| TW | 200618147 A | 6/2006 |

OTHER PUBLICATIONS

Office Action dated Sep. 9, 2016 for Korean Application No. 2015-7033066, 10 pages.

Fei, Qin et al., "Strain Rate Effects and Rate-Dependent Constitutive Models of Lead-Based and Lead-Free Solders," Journal of Applied Mechanics, Sep. 30, 2009, vol. 77, 12 pages.

Search Report dated Feb. 10, 2017 for Taiwanese Patent Application No. 104138271, 2 pages.

* cited by examiner

SOLDER CONTACTS FOR SOCKET ASSEMBLIES

CROSS-REFERENCE TO RELATED APPLICATION

The present application is a national phase entry under 35 U.S.C. §371 of International Application No. PCT/US2014/071750, filed Dec. 20, 2014, entitled "SOLDER CONTACTS FOR SOCKET ASSEMBLIES," which designates the United States of America, the entire disclosure of which is hereby incorporated by reference in its entirety and all purposes.

FIELD

Embodiments of the present disclosure generally relate to the field of integrated circuits, and more particularly, to socket contact techniques and configurations.

BACKGROUND

As high-performance architecture increases in complexity, socket connections for this architecture increases as well. For example, pin counts for socket assemblies for particular central processing units (CPUs) have increased over 3.5 times within a few generations. Further, socket pins must typically be seated at a particular force in order to provide a proper electrical connection. For example, in some land-grid array (LGA) assemblies, obtaining proper contact with gold pins and pads may require a load force of 25 gram-force (gf) or higher. However, total force required to seat a processor into a socket may increase linearly with pin counts. As pin counts increase, the total three used to seat the processor package may increase as well. Further, socket contacts and die packages may be fragile in nature and exposed to bending or other damage during handling or assembly. Thus, as total forces increase, the likelihood of bending, cracking or other mishaps increases.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe socket contact techniques and configurations including solder contacts. In various embodiments, solder contacts may be used to provide an electrical connection between pins of a socket assembly and electrical contacts of a die package. In various embodiments, these solder contacts may be composed of a soft solder that facilitates electrical conduction under lower load forces than may be used in other socket assemblies.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

Figure 1:
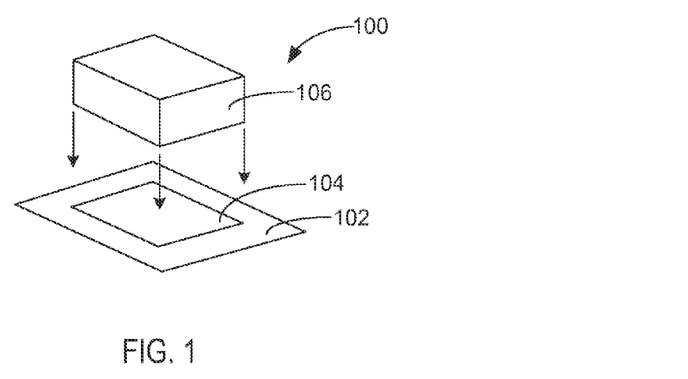
FIG. 1 schematically illustrates a perspective view of an example integrated circuit (IC) package assembly, in accordance with some embodiments.

FIG. 1 schematically illustrates a perspective view of an example integrated circuit (IC) package assembly 100, in accordance with some embodiments. The IC package assembly 100 may include a socket assembly 104 coupled with a circuit board or other suitable electronic substrate (hereinafter "circuit board 102"). The IC package assembly 100 may further include a die or die package (hereinafter "die package 106") electrically coupled with the circuit board 102 through the socket assembly 104.

The socket assembly 104 may include, for example, a land-grid array (LGA) socket having an array of electrical contacts, also referred to herein as "pins", that are configured to route electrical signals between the die package 106 and the circuit board 102. According to various embodiments, the socket assembly 104 may comport with embodiments described herein. For example, in some embodiments, the die package 106 may comport with embodiments described in connection with FIGS. 4 and 5 to include solder contacts on the die package 106 to provide for electrical coupling between the die package 106 and the socket assembly 104 under reduced load forces. In another example, in some embodiments, the socket assembly 104 may comport with embodiments described in connection with FIG. 6 to include solder contacts on electrical contacts of the socket assembly 104 that provide for electrical coupling between the die package 106 and the socket assembly 104 under reduced load forces. Other embodiments may provide for suitable combinations of these embodiments.

In some embodiments, the circuit board 102 may be a printed circuit board (PCB) composed of an electrically insulative material such as an epoxy laminate. The circuit board 102 may include electrically insulating layers composed of materials such as, for example, polytetrafluoroethylene, phenolic cotton paper materials such as Flame Retardant 4 (FR-4), FR-1, cotton paper and epoxy materials including composite epoxy material (CEM) such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die package 106 through the circuit board 102. The circuit board 102 may be composed of other suitable materials in other embodiments. For example, in some embodiments, the circuit board 102 may be an epoxy-based laminate substrate having a core and/or build-up layers such as, for example, an Ajinomoto Build-up Film (ABF) substrate. In some embodiments, the circuit board 102 is a motherboard (e.g., motherboard 802 of FIG. 8).

The die package 106 may include one or more dies in any of a wide variety of suitable configurations. For example, in various embodiments, the die package 106 may be a central processing unit (CPU) package or a graphics processing unit (GPU). The die package 106 may include one or more dies that are encapsulated, at least partially, in a protective enclosure such as, for example, a mold compound or other suitable protective housing. In some embodiments, the die package 106 may include alignment features to facilitate coupling of the die package 106 with corresponding alignment features of the socket assembly 104.

The die package 106 may include one or more dies made from a semiconductor material (e.g., silicon) and having circuitry formed using semiconductor fabrication techniques such as thin film deposition, lithography, etching and the like used in connection with forming complementary metal-oxide-semiconductor (CMOS) devices. In some embodiments, the one or more dies of the die package 106 may be, include, or be a part of a processor, memory, SoC or ASIC. The one or more dies in the die package 106 may include a wide variety of configurations including, for example, suitable combinations of flip-chip and/or wire-bonding configurations, interposers, multi-chip package configurations including system-in-package (SiP) and/or package-on-package (PoP) configurations.

Figure 2:
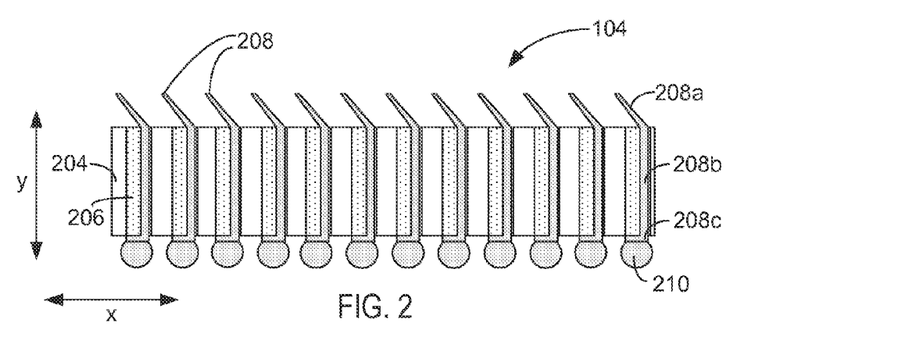
FIG. 2 schematically illustrates a cross-section side view of an example socket assembly, in accordance with some embodiments.

FIG. 2 schematically illustrates a cross-section side view of an example socket assembly 104 including socket housing 204 with electrically conductive pins 208, in accordance with some embodiments. In some embodiments, the socket housing 204 (also referred to as "socket substrate" herein) may include a plurality of openings 206 disposed between a first side, S1, and opposing second side, S2, of the socket housing 204, as can be seen. The pins 208 may be physically coupled with the socket housing 204 in corresponding openings of the plurality of openings 206. For example, the pins 208 may be physically coupled with the socket housing 204 using mechanical stitching features. In some embodiments, the pins 208 may extend through the openings 206 to route electrical signals such as, for example, input/output (I/O) signals or power/ground of a die (e.g., die package 106 of FIG. 1), through the socket housing 204.

The socket housing 204 may be composed of any of a wide variety of suitable materials including, for example, polymers, ceramics or semiconductor materials. The socket housing 204 may be composed of other suitable materials in other embodiments.

The pins 208 may be leads of an LGA socket configuration in some embodiments. For example, the pins 208 may be J-leads, which may be so named because, from a side view, each of the J-leads may have a profile resembling the letter J, as can be seen. The pins 208 may be composed of an electrically conductive material such as metal.

In some embodiments, the pins 208 may comport with embodiments described in connection with FIGS. 3-7 and vice versa. For example, in some embodiments, such as in the examples of FIGS. 3-5, rather than including J-leads, the pins 208 may have differently shaped profiles, such as substantially straight profiles. Additionally, in some embodiments, such as in the examples of FIGS. 3-5, the pins 208 may be shaped so as to penetrate corresponding solder contacts of a die package 106 as discussed below.

In some embodiments, each of the pins 208 may have a contact portion 208a, a leg portion 208b, and a foot portion 208c, as can be seen. The contact portion 208a may extend beyond a surface of the socket housing 204 to make electrical contact with corresponding interconnect features on a die package (e.g., die package 106 of FIG. 1). The leg portion 208b may extend through the openings 206. The foot portion 208c (sometimes referred to as "paddle") may have a surface that is configured to directly couple with solderable material 210 (e.g., solder ball) to form a solder joint (e.g., between a socket assembly 104 and a circuit board 102 of FIG. 1).

In some embodiments, the leg portion 208b may extend in a first direction, indicated by the x-axis, and the foot portion 208c may include a surface that extends in a second direction, indicated by the y-axis, that is perpendicular to the first direction, as can be seen. In various embodiments, the leg portion 208b may extend away from the surface of the foot portion 308c at an angle that is substantially perpendicular (e.g., +/−10° of being perpendicular) or that angles away (e.g., +/−40° of being perpendicular). The profile shape of the pins 208 is merely one example and may include any of a wide variety of other profile shapes in other embodiments.

Figure 3:
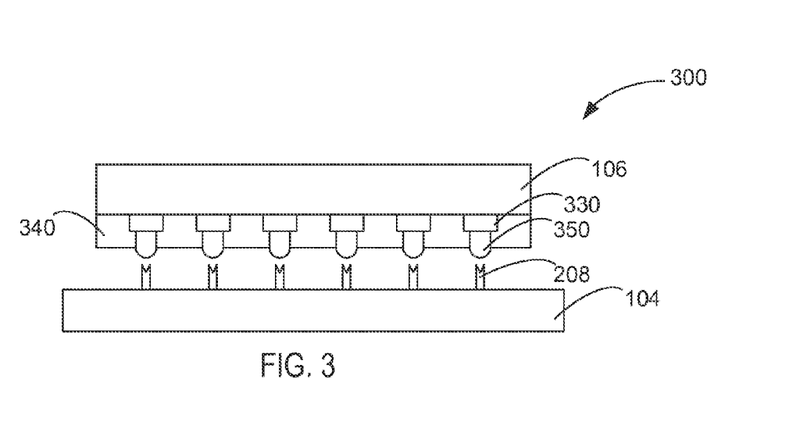
FIG. 3 schematically illustrates a cross-section side view of an example package assembly including a die package having solder contacts, in accordance with some embodiments.

FIG. 3 schematically illustrates a cross-section side view of an example package assembly 300 including a die package 106 including solder contacts 350, in accordance with some embodiments. The solder contacts 350 may, in various embodiments, be disposed on the bottom surface of the die package 106 such that electrical contacts 330 of the die package 106 are in conductive contact with the solder contacts 350. The solder contacts may further be disposed such that the solder contacts 350 may be conductively coupled to one or more pins 208 of the socket assembly 104, such as when the die package 106 is coupled to the socket assembly 104. In various embodiments, the solder contacts 350 may thus provide electrical conduction between the electrical contacts 330 of the die package 106 and the pins 208 of the socket assembly 104. As illustrated in FIG. 3, the pins 208 may have a configuration used to penetrate the solder contacts 350, thus providing for better electrical conductivity between the pins 208 and the solder contacts 350 (and then in turn between the pins 208 and the electrical contacts 330 of the die package 106). Particular examples of pin configurations are described below.

In various embodiments, solder resist material 340 may be disposed on the bottom surface of the die package 106. The solder resist material 340 may be placed on the bottom surface of the die package 106 prior to placement of the solder contacts 350 in order to facilitate placement of the solder contacts 350 on the die package 106. Various types of solder resist material 340 may be used in various embodiments. In various embodiments, the solder resist material 340 may be placed on the bottom surface of the die package 106 such that there are voids on the bottom surface over areas where the electrical contacts 330 are located. These voids may then be filled with solder using known techniques to form the solder contacts 350 in contact with the electrical contacts 330. For example, in some embodiments, injection mold soldering may be used to inject liquid solder into the voids, thus producing the solder contacts 350. In another example, the die package may be attached using a bath of molten solder, where the bottom surface of the die package 106 (including the solder resist material 340) is dipped, or otherwise temporarily placed, in the bath of molten solder. Because the solder resistant material 340 may not provide for solder adherence, the molten solder from the bath may only adhere to the voids where the electrical contacts 330 of the die package are located. In yet other embodiments, solder balls may be directly deposited on the bottom surface of the die package 106.

In various embodiments, the solder contacts 350 may be composed of a soft solder that facilitates electrical conduction under lower load forces than may be used in socket assemblies that do not utilize the solder contacts 350. For example, as mentioned above, some LGA assemblies using gold pins and pads may require a load force of 25 gf or higher in order to create a necessary connection between the pins and pads of the die package. In contrast, by using a soft solder, various embodiments may allow for electrical connections between pins 208 and electrical contacts 330 of the die package 106 utilizing load forces below 25 gf. In various embodiments, the solder contacts 350 may be composed of a solder that provides for an electrical connection with a resistance of less than 25 mOhm, or more specifically between 20-25 mOhm. In various embodiments, in order to provide the desired electrical conductivity under lower load forces, solder contacts 350 may include compounds exhibiting a strain rate of 0.1/second at a pressure of less than or equal to 70 megapascals (MN) or compounds exhibiting a strain rate of 0.0001/second at a pressure of less than or equal to 30 MPa.

In various embodiments, different compositions of soft solder may be utilized. Because the solder contacts 350 are located during usage between the electrical contacts 330 of the die package 106 and the pins 208 of the socket assembly 104, the solder contacts 350 may exhibit a contact resistance between these structures. This contact resistance may be related, in various embodiments, to the hardness of the solder used in the solder contact 350 and the load force applied at the connection. Additionally, because solder materials may form oxides on their surface, contact resistance may also be related to qualities of the oxides of the solder material used in the solder contacts 350. In various embodiments, the contact resistance between two materials may follow the following relationship:

$$R_c = (\rho_1 + \rho_2)/2 * (\pi H/4F)^{1/2} + \rho_{oxides} d_{oxides} H_{oxides}/F^K,$$

where $R_c$ is the contact resistance between the pins 208 and the electrical contacts 330, $\rho_1$ and $\rho_2$ are the respective electrical resistivities of the pins 208 and the electrical contacts 330, H is the hardness of the solder used in the solder contact 350, F is the load applied to the connection, $\rho_{oxides}$ is the electrical resistivity of the oxides of the solder used in the solder contact 350, $d_{oxides}$ is the thickness of the oxides of the solder used in the solder contact 350, and $H_{oxides}$ is the hardness of the oxides of the solder used in the solder contact 350. Also, as used in the equation, K is a value relating to whether the oxide film on the solder contact 350 has been penetrated. Before penetration K=1; after penetration K may be much greater than 1. As may be seen in the equation above, contact resistance may be lowered by using one or more of: a softer solder materials, solder materials with softer or thinner oxide films, and/or combinations of solder materials and pins that provide for penetration of the solder material's oxide film when the die package 106 is loaded into the socket assembly 104.

In various embodiments, the solder contacts 350 may contain a solder including indium. In particular embodiments, the soft-solder contacts may include substantially only indium, or may include only pure indium. In various embodiments, "pure indium" may include compounds or mixtures that consist of 99% or higher indium and less than 1% of other materials. In various embodiments, substantially indium-containing solders may be utilized because indium has a higher melting temperature (~157° C.) than typical shipment temperatures for socket assemblies (~55° C.). Additionally, indium oxides are relatively soft compared to oxides of other solder materials, and thus easily penetrated by the pins 208, thus providing needed electrical conductivity at lower load forces.

In other embodiments, solders that are not pure indium (or substantially pure indium) may be used. For example, the solder contacts 350 may include solders with melting points between 55° C. and 80° C., as these melting points are higher than likely shipping temperatures (~55° C.), but lower than likely operating temperatures (~80° C.). Such solder compounds are therefore likely to be stable during shipping but still to provide electrical conduction during actual operation, as the solder may provide low contact resistance once it reaches its melting point at operational temperatures. In various embodiments, solder contacts 350 may be used containing mixtures of tin, bismuth and indium that exhibit melting points in these ranges. For example, one known eutectic tin-indium-bisrnuth alloy exhibits a melting point of 55° C. and another exhibits a melting point of 77° C. Additionally, a eutectic indium-bismuth alloy exhibits a melting point of 72° C. Other alloys, such as gallium-containing alloys, which may be liquid at operating temperatures, or have low melting points, may also be used.

The following chart illustrates example strain rates at various pressures for solders including substantially indium solder, substantially tin solder, and an indium-tin-bismuth alloy. It may be recognized that, while data for particular solders is shown, in various embodiments, solders exhibiting other aspects may be utilized in accordance with embodiments described herein. The hardness values illustrated were determined using a Berkovich tip, as may be understood by those of ordinary skill:

| Strain Rate (/sec) | Material | Hardness Mean (MPa) | Hardness st. dev. (MPa) |
|---|---|---|---|
| .0001 | In | 13.68 | 1.48 |
| .0001 | Sn | 60.08 | 4.78 |
| .0001 | In—Sn—Bi | 22.75 | 8.80 |
| .001 | In | 17.95 | 1.87 |
| .001 | Sn | 76.81 | 5.53 |
| .001 | In—Sn—Bi | 26.93 | 11.08 |
| .1 | In | 29.39 | 1.66 |
| .1 | Sn | 137.86 | 8.25 |
| .1 | In—Sn—Bi | 109.71 | 23.48 |
| 1 | In | 36.63 | 2.47 |
| 1 | Sn | 222.82 | 14.84 |
| 1 | In—Sn—Bi | 255.45 | 74.70 |

Figure 4:
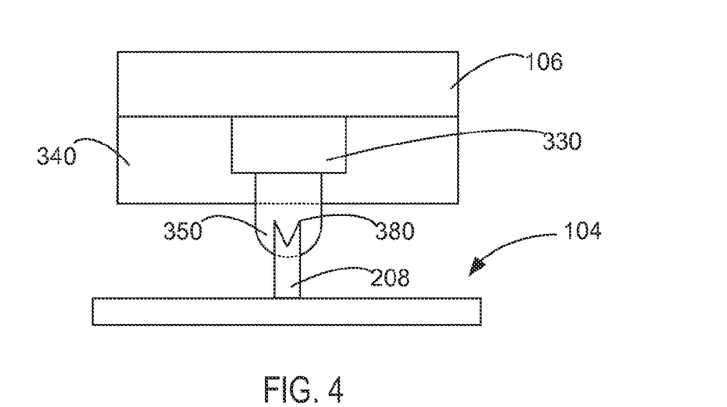
FIG. 4 schematically illustrates a cross-section side view of an example package assembly including a die package having solder contacts and a socket assembly, in accordance with some embodiments.

FIG. 4 schematically illustrates a cross-section side view of an example package assembly 100 including the die package 106 including solder contacts 350 and the socket assembly 104, in accordance with some embodiments. In the illustration, a single pin 208, solder contact 350, and electrical contact 330 are illustrated; in various embodiments, additional pins, solder contacts, and electrical contacts may be used. As illustrated in FIG. 4, when the die package 106 is coupled to the socket assembly 104, in various embodiments, the pin 208 may be disposed to contact the solder contact 350 under a load force, providing conductive connection between the pin 208 and the electrical contact 330 of the die package 106. This electrical connection may be created, in various embodiments, regardless of whether the pin 208 is in physical contact with the electrical contact 330.

In various embodiments, in order to facilitate electrical connection between the pin 208 and the electrical contact 330, the pin 208 may be disposed to penetrate the solder contact 350 under the load force applied to couple the die package 106 and the socket assembly 104. In various embodiments, the pin 208 may be configured to penetrate the solder contact 350 in order to reduce resistive effects of any oxides that may be on the surface of the solder contact 350. In order to facilitate the penetration of the solder contact 350 by the pin 208, the pin 208 may be configured to include a penetrating edge 380. In various embodiments, the penetrating edge 380 may be configured to present a smaller surface area to the solder contact 350 when under a load force, thus increasing the likelihood of penetration of the solder contact 350. In various embodiments, the pin 208 may taper to present the penetrating edge 380 at the end of the pin 208. In some embodiments, the pin 208 may taper to the penetrating edge in a substantially perpendicular direction (e.g., +/−10° of being perpendicular) from the socket assembly 104. In various embodiments, the penetrating edge 380 may include a substantially straight edge and/or a curved edge. In various embodiments, such as when the pin 208 has a substantially circular cross-section, the penetrating edge 380 may include a ring along the edge of the pin 208. In various embodiments, in addition to or in lieu of using an edge 380, the pin 208 may include one or more pointed projections to penetrate the solder contact 350.

Figure 5:
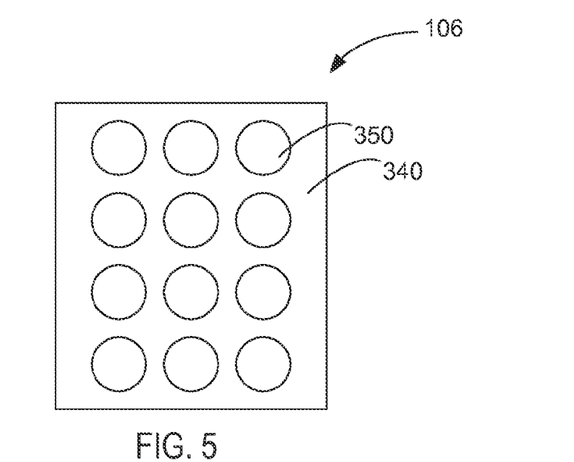
FIG. 5 schematically illustrates a bottom view of a die package including solder contacts for coupling with pins of a socket assembly, in accordance with some embodiments.

FIG. 5 schematically illustrates a bottom view of a die package 106 including solder contacts 350 for coupling with pins 208 of a socket assembly 104, in accordance with some embodiments. As illustrated in FIG. 5, the die package 106 may include multiple solder contacts 350, as well as the solder resist material 340; however, in some embodiments, as discussed above, no solder resist material may be utilized. The solder contacts 350 may, in various embodiments, be arranged in one or more lines as well as in a grid, as in the example illustrated in FIG. 5. In various embodiments, the solder contacts 350 may be placed with sufficient spacing such that pins 208 of the socket assembly 104 may be unlikely to encounter more than one solder contact 350 when under a load force. In particular, in embodiments where the contact portion 208a of the pins 208 is disposed at an angle relative to the bottom surface of the die package 106, the solder contacts 350 may be spaced apart so that the contact portions 208a are unlikely to encounter two or more solder contacts 350 when under a load force.

Figure 6:
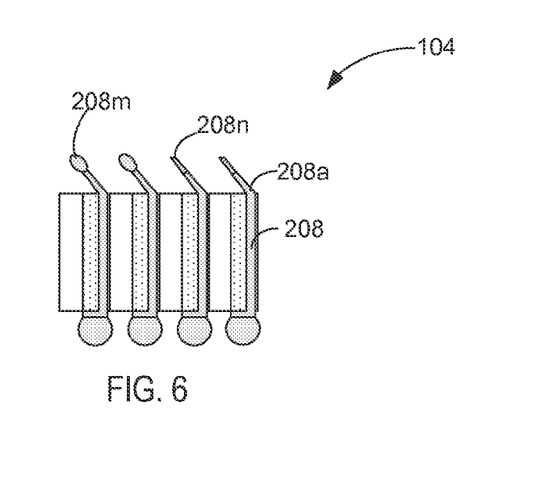
FIG. 6 schematically illustrates a cross-section side view of an example socket assembly including socket housing with pins including solder contacts, in accordance with some embodiments.

FIG. 6 schematically illustrates a cross-section side view of an example socket assembly 104 including pins 208 including solder contacts, in accordance with some embodiments. As illustrated in the example of FIG. 6, in various embodiments, solder contacts may be disposed on the surface of one or more of the pins 208 of the socket assembly 104, in addition to or lieu of disposition of solder contacts 350 on the bottom surface of the die package 106. While various pins 208 are illustrated in FIG. 6 with particular dispositions of solder, it may be recognized that, in various embodiments, the same type of solder contact may be placed on various combinations of pins 208, including all pins 208, fewer than all pins 208, or no pins 208. Thus, as illustrated in FIG. 6, a solder contact bead 208m may be placed on the contact portion 208a of a pin 208, In various embodiments, the solder contact bead 208m may be placed through dipping or other placement of the pin 208 in molten solder. In another illustrated example, in various embodiments, solder may be plated onto the contact portion 208a of a pin 208, resulting in a plated solder contact 208n. In various embodiments, the solder may be plated using any suitable technique including, for example, electroless plating. In each configuration (beading or plating), the solder may be disposed on the surface of the contact portion 208a such that the beaded or plated solder is in electrical coupling with the pin 208.

Figure 7:
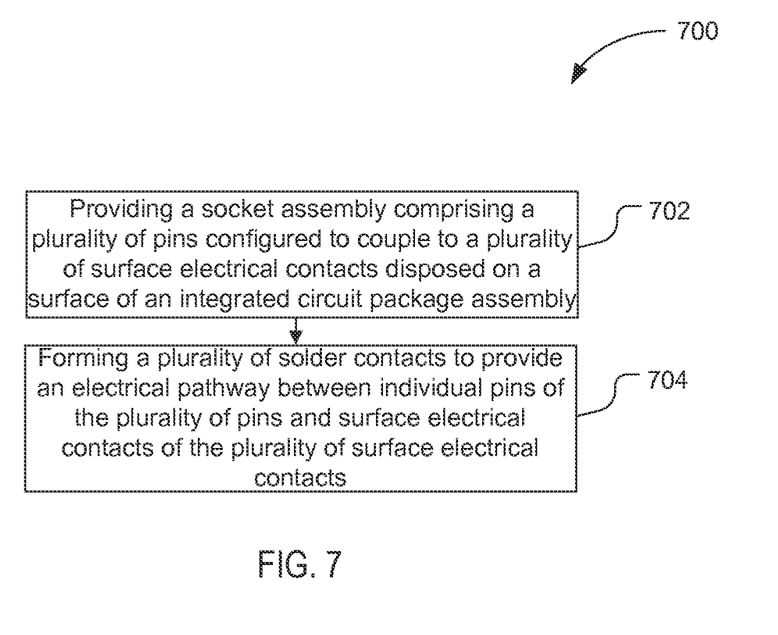
FIG. 7 schematically illustrates a flow diagram for a method of fabricating an IC package assembly, in accordance with some embodiments.

FIG. 7 schematically illustrates a flow diagram for a method 700 of fabricating an IC package assembly (e.g., IC package assembly 100 of FIG. 1), in accordance with some embodiments. The method 700 may comport with embodiments described in connection with FIGS. 1-6. At 702, the method 700 may include providing a socket assembly (e.g., socket assembly 104 of FIGS. 1-4) comprising a plurality of pins (e.g., pins 208 of FIGS. 2-4) configured to couple to a plurality of surface electrical contacts (e.g., electrical contacts 330 of FIGS. 3 and 4) disposed on a surface of an integrated circuit package assembly (e.g., die package 106 of FIGS. 1, 3 and 4).

At 704, the method may include forming a plurality of solder contacts (e.g., solder contacts 350 of FIGS. 3-6) to provide an electrical pathway between individual pins of the plurality of pins and surface electrical contacts of the plurality of surface electrical contcts. In various embodiments, such forming a plurality of solder contacts may include beading or plating individual solder contacts of the plurality of soft-solder contacts onto the surface of respective individual pins of the plurality of the pins (e.g., solder contact bead 208m and/or plated solder contact 208n of FIG. 6). In various embodiments, such forming a plurality of solder contacts may include disposing individual solder contacts of the plurality of solder contacts on respective surface electrical contacts of the surface electrical contacts of the IC package assembly.

Various operations are described as multiple discrete operations in turn, in a manner that is most helpful in understanding the claimed subject matter. However, the order of description should not be construed as to imply that these operations are necessarily order dependent.

Figure 8:
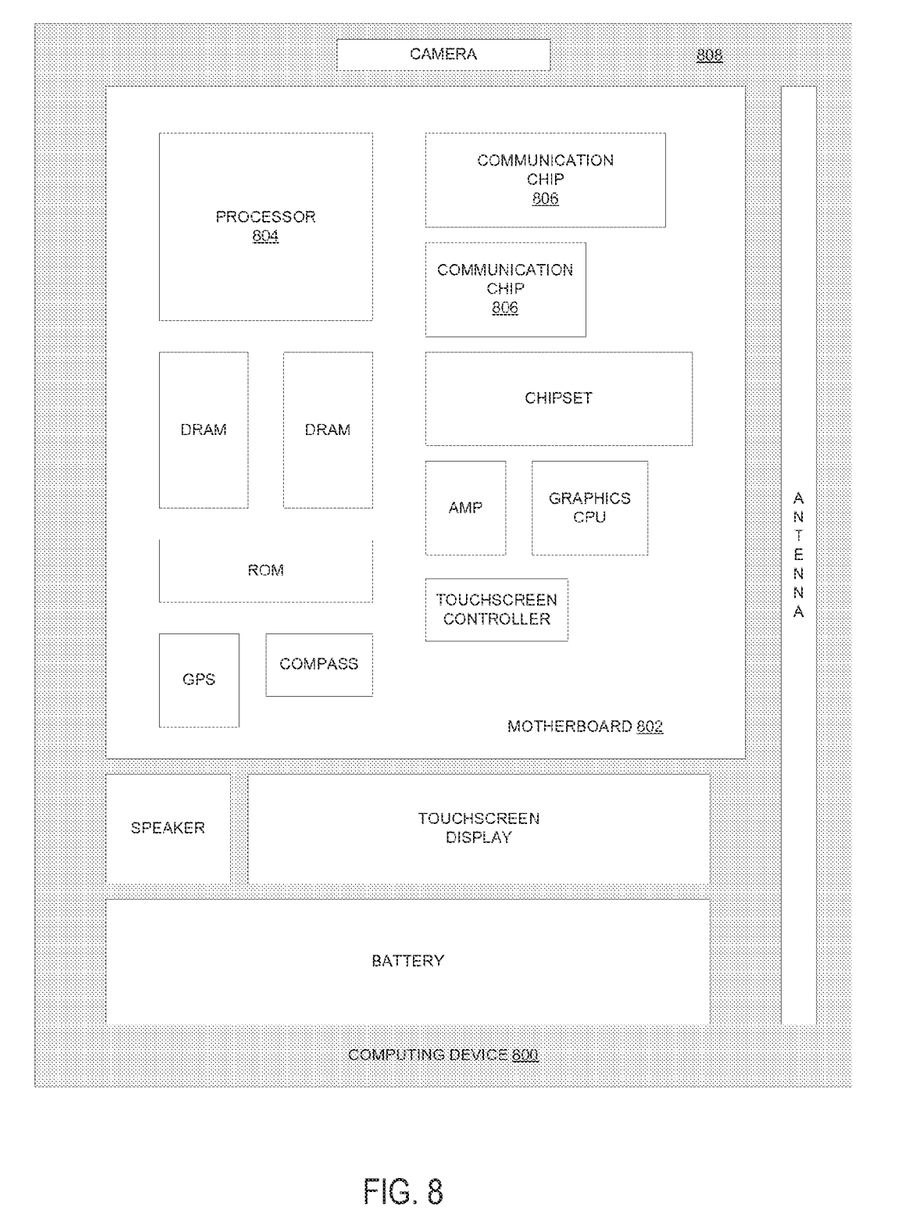
FIG. 8 schematically illustrates a computing device that includes an IC package assembly as described herein, in accordance with some embodiments.

Embodiments of the present disclosure may be implemented into a system using any suitable hardware and/or software to configure as desired. FIG. 8 schematically illustrates a computing device 800 that includes an IC package assembly (e.g., IC package assembly 100 of FIG. 1) as described herein, in accordance with some embodiments. The computing device 800 may house a board such as motherboard 802 (e.g., in housing 808). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Ei (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LYE, EV-DO, and others.

The processor 804 of the computing device 800 may be packaged in an IC package assembly (e.g., IC package assembly 100 of FIG. 1) as described herein. For example, the circuit board 102 of FIG. 1 may be a motherboard 802 and the processor 804 may be a die of the die package 106 that is coupled with a socket assembly 104 mounted on the circuit board 102 according to techniques and configurations described herein (e.g., using solder contacts 350 of FIGS. 3-6). Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 806 may also include a die that may be packaged in an IC package assembly (e.g., IC package assembly 100 of FIG. 1) as described herein. In further implementations, another component (e.g., memory device or other integrated circuit device) housed within the computing device 800 may include a die that may be packaged in an IC package assembly (e.g., IC package assembly 100 of FIG. 1) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 800 may be a mobile computing device in some embodiments. In further implementations, the computing device 800 may be any other electronic device that processes data.

EXAMPLES

Example 1 may include an integrated circuit (IC) package assembly. The IC package assembly may include a plurality of electrical contacts configured to route electrical signals of an integrated circuit. The IC package assembly may also include a plurality of solder contacts coupled to the electrical contacts and disposed to directly couple to pins of a socket assembly to provide an electrical connection between the pins of the socket assembly and the plurality of electrical contacts.

Example 2 may include the IC package assembly of example 1, wherein the solder contacts may include a solder exhibiting a strain rate of 0.1/second at a pressure of less than or equal to 70 megapascals (MPa) or a solder exhibiting a strain rate of 0.0001/second at a pressure of less than or equal to 30 MPa.

Example 3 may include the IC package assembly of example 1, wherein the solder contacts may include a solder including indium.

Example 4 may include the IC package assembly of example 3, wherein the solder may be pure indium solder.

Example 5 may include the IC package assembly of example 3, wherein the solder may be a tin-indium-bismuth solder.

Example 6 may include the IC package assembly of any of examples 1-6, wherein the solder contacts may include a solder with a melting point above a shipping temperature.

Example 7 may include the IC package assembly of example 6, wherein the shipping temperature may be above 55° C.

Example 8 may include the IC package assembly of any of examples 1-6, wherein the solder contacts may include a solder including one or more compounds whose oxides have a substantively low resistance.

Example 9 may include the IC package assembly of any of examples 1-6, further including the socket assembly, wherein the socket assembly may be a land-grid array (WA) socket assembly.

Example 10 may include the IC package assembly of any of examples 1-6, wherein the solder contacts may provide electrical coupling between the pins and the plurality of electrical contacts at load forces less than 25 gram-force.

Example 11 may include the IC package assembly of example 1, wherein the solder contacts may include a solder containing gallium.

Example 12 may include a socket assembly. The socket assembly may include a plurality of pins configured to couple to a plurality of surface electrical contacts disposed on a surface of a die package. The plurality of solder contacts may provide an electrical pathway between individual pins of the plurality of pins and surface electrical contacts of the plurality of surface electrical contacts.

Example 13 may include the socket assembly of example 12, wherein individual solder contacts of the plurality of solder contacts are disposed on the surface of respective individual pins of the plurality of the pins.

Example 14 may include the socket assembly of example 13, wherein the individual solder contacts of the plurality of soft-solder contacts may be plated onto the respective individual pins of the plurality of the pins.

Example 15 may include the socket assembly of example 13, wherein the individual solder contacts of the soft-solder contacts may be beaded onto the respective individual pins of the plurality of the pins.

Example 16 may include the socket assembly of example 12, wherein individual solder contacts of the plurality of soft-solder contacts may be disposed on respective surface electrical contacts of the surface electrical contacts of the die package.

Example 17 may include the socket assembly of example 16, wherein the individual pins may each include one or more pointed portions configured to penetrate the solder contact during coupling of the die package with the socket assembly.

Example 18 may include the socket assembly of any of examples 12-17, wherein the socket assembly is a land-grid array socket assembly.

Example 19 may include a computing device. The computing device may include a circuit board. The computing device may include a socket assembly coupled with the circuit board, the socket assembly that may include a plurality of pins configured to electrically couple to a plurality of surface electrical contacts disposed on a surface of a die package. The computing device may also include the die package. The die package may include the plurality of electrical contacts configured to route electrical signals of a die of the die package, and a plurality of solder contacts disposed to provide an electrical connection between the pins of the socket assembly, and the plurality of electrical contacts.

Example 20 may include the computing device of example 19, wherein: the circuit board may be a motherboard and the computing device may be a mobile computing device including one or more of a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Example 21 may include the computing device of any of examples 19 or 20, wherein the solder contacts may include a solder exhibiting a strain rate of 0.1/second at a pressure of less than or equal to 70 MPa or a solder exhibiting a strain rate of 0.0001/second at a pressure of less than or equal to 30 MPa.

Example 22 may include a method include. The method may include providing a socket assembly, including a plurality of pins configured to couple to a plurality of surface electrical contacts disposed on a surface of an integrated circuit (IC) package assembly. The method may also include forming a plurality of solder contacts to provide an electrical pathway between individual pins of the plurality of pins and surface electrical contacts of the plurality of surface electrical contacts.

Example 23 may include the method of example 22, wherein forming a plurality of solder contacts may include beading or plating individual solder contacts of the plurality of solder contacts onto the surface of respective; individual pins of the plurality of the pins.

Example 24 may include the method of example 22, wherein forming a plurality of solder contacts may include disposing individual solder contacts of the plurality of solder contacts on respective surface electrical contacts of the surface electrical contacts of the IC package assembly.

Example 25 may include the method of example 24, wherein: the individual pins each include one or more pointed portions and the method further includes penetrating one or more respective solder contacts with one or more of the individual pins to couple the IC package assembly with the socket assembly.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) package assembly, comprising:
   a plurality of electrical contacts configured to route electrical signals of an integrated circuit; and
   a plurality of solder contacts coupled to the electrical contacts and disposed to directly couple to pins of a land-grid array (LGA) socket assembly to provide an electrical connection between the pins of the (LGA) socket assembly and the plurality of electrical contacts, wherein the plurality of solder contacts comprise a substantially indium-containing solder.

2. The IC package assembly of claim 1, wherein the solder contacts comprise a solder exhibiting a strain rate of 0.1/second at a pressure of less than or equal to 70 megapascals (MPa) or a solder exhibiting a strain rate of 0.0001/second at a pressure of less than or equal to 30 MPa.

3. The IC package assembly of claim 1, wherein the solder is pure indium solder.

4. The IC package assembly of claim 1, wherein the solder is a tin-indium-bismuth solder.

5. The IC package assembly of claim 1, wherein the solder contacts comprise a solder with a melting point above a shipping temperature.

6. The IC package assembly of claim 5, wherein the shipping temperature is above 55° C.

7. The IC package assembly of claim 1, wherein the substantially indium-containing solder includes one or more compounds whose oxides have a substantively low resistance.

8. The IC package assembly of claim 1, wherein the solder contacts provide electrical coupling between the pins and the plurality of electrical contacts at load forces less than 25 gram-force.

9. The IC package assembly of claim 1, wherein the solder contacts comprise a solder containing gallium.

10. A land-grid array (LGA) socket assembly, comprising;
    a plurality of pins configured to couple to a plurality of surface electrical contacts disposed on a surface of a die package; and
    a plurality of solder contacts that provide an electrical pathway between individual pins of the plurality of pins and surface electrical contacts of the plurality of surface electrical contacts, wherein the plurality of solder contacts comprise a substantially indium-containing solder.

11. The LGA socket assembly of claim 10, wherein individual solder contacts of the plurality of solder contacts are disposed on the surface of respective individual pins of the plurality of the pins.

12. The LGA socket assembly of claim 11, wherein the individual solder contacts of the plurality of solder contacts are plated onto the respective individual pins of the plurality of the pins.

13. The LGA socket assembly of claim 11, wherein the individual solder contacts of the solder contacts are beaded onto the respective individual pins of the plurality of the pins.

14. The LGA socket assembly of claim 10, wherein individual solder contacts of the plurality of solder contacts are disposed on respective surface electrical contacts of the surface electrical contacts of the die package.

15. The LGA socket assembly of claim 14, wherein the individual pins each comprise one or more pointed portions configured to penetrate the solder contact at a load force of less than 25 gram-force during coupling of the die package with the LGA socket assembly.

16. The socket assembly of claim 10, wherein the solder is pure indium solder.

17. The socket assembly of claim 10, wherein the solder is a tin-indium-bismuth solder.

18. A computing device comprising:
    a circuit board;
    a land-grid array (LGA) socket assembly coupled with the circuit board, the LGA socket assembly comprising a plurality of pins configured to electrically couple to a plurality of surface electrical contacts disposed on a surface of a die package; and
    the die package, comprising:
        the plurality of electrical contacts configured to route electrical signals of a die of the die package, and
        a plurality of solder contacts disposed to provide an electrical connection between the pins of the socket assembly and the plurality of electrical contacts, wherein the plurality of solder contacts comprise a substantially indium-containing solder.

19. The computing device of claim 18, wherein:
    the circuit board is a motherboard; and
    the computing device is a mobile computing device including one or more of a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

20. The computing device of claim 18, wherein the solder contacts comprise a solder exhibiting a strain rate of 0.1/ second at a pressure of less than or equal to 70 MPa or a solder exhibiting a strain rate of 0.0001/second at a pressure of less than or equal to 30 MPa.

21. A method comprising:
provided a land-grid array (LGA) socket assembly, comprising a plurality of pins configured to couple to a plurality of surface electrical contacts disposed on a surface of an integrated circuit (IC) package assembly;
forming a plurality of solder contacts to provide an electrical pathway between individual pins of the plurality of pins and surface electrical contacts of the plurality of surface electrical contacts, wherein the solder contacts comprise a substantially indium-containing solder.

22. The method of claim 21, wherein forming a plurality of solder contacts comprises beading or plating individual solder contacts of the plurality of solder contacts onto the surface of respective individual pins of the plurality of the pins.

23. The method of claim 21, wherein forming a plurality of solder contacts comprises disposing individual solder contacts of the plurality of solder contacts on respective surface electrical contacts of the surface electrical contacts of the IC package assembly.

24. The method of claim 23, wherein:
the individual pins each comprise one or more pointed portions; and
the method further comprises penetrating one or more respective solder contacts with one or more of the individual pins to couple the IC package assembly with the LGA socket assembly.

* * * * *